June 26, 1962 H. I. BOREEN 3,041,553

FREQUENCY MODULATED OSCILLATOR

Filed March 9, 1959

Inventor:
Henry I. Boreen,
by Paris, Haskell, and Levine
Attorney.

3,041,553
FREQUENCY MODULATED OSCILLATOR
Henry I. Boreen, Elkins Park, Pa., assignor to Vector Manufacturing Co., Inc., a corporation of Pennsylvania
Filed Mar. 9, 1959, Ser. No. 798,077
18 Claims. (Cl. 332—16)

Figures 1, 2:
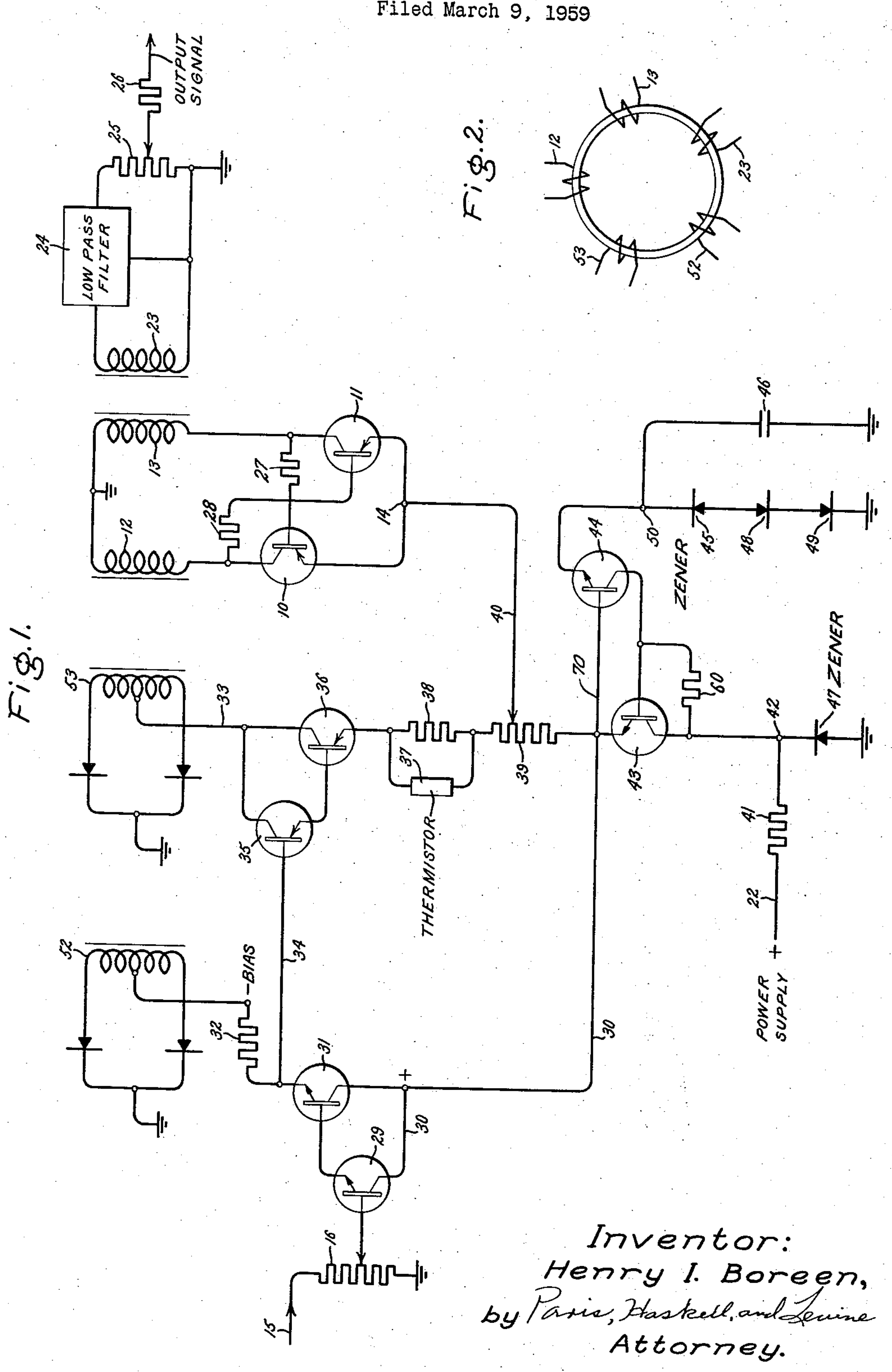

This invention generally relates to improvements in frequency modulated oscillators and more particularly to oscillators whose frequency may be linearly varied in response to variation of a voltage.

With the need for conveying greater amounts of intelligence by radio means more rapidly; the size, weight and power consumption of the components become important considerations, and it has become progressively more essential to miniaturize and sub-miniaturize the equipment without sacrificing performance. The problems involved in transmitting intelligence between airborne and ground stations are particularly severe since the airborne equipment must not only be reduced in size, weight, and power consumption, but must be relatively unaffected by shock and variation in temperature, power supply voltage and the like.

The present invention is primarily concerned with a voltage controlled frequency modulated oscillator which may be employed for such applications as telemetering and the like between ground stations or ground and airborne locations. Although the frequency modulated carrier from such an oscillator may be used directly as the transmission medium, it is known that more data can be transmitted if a number of such oscillators are used, each generating a lower frequency sub-carrier signal, and all being used to modulate a higher frequency carrier. Consequently, the present invention is most concerned with oscillators of the type known as telemetering sub-carrier oscillators and the problems arising in such devices, although it is to be understood, of course, that the invention is not limited to such applications but may be applied for many other purposes.

The use of conventional oscillators employing feedback of the L-C tank type for such applications presents two major difficulties. First, such sub-carrier oscillators for use in the FM/AM telemetering channels have been allocated the low frequency band of from 0.4–70 kilocycles, and in this frequency range rather large and heavy coils and capacitors are required to provide the necessary stable resonant tank circuit. Secondly, at these low frequencies it is not practically feasible to linearly vary the frequency of an L-C oscillator over the range needed to convey the necessary information. Consequently the L-C oscillator circuits have been found unsatisfactory both performancewise and from a weight and size standpoint for these applications.

According to the present invention, there is provided a voltage controlled frequency modulated oscillator of greatly reduced size, weight, and power consumption that incorporates means providing great stability and producing a frequency modulated output signal that is linearly related to the amplitude of an input voltage modulating signal over a wide range. To obtain these improved features, there is generally provided in its preferred form a transistorized multivibrator circuit, operating in push pull though square hysteresis loop core transformer windings, whose frequency may be linearly varied over a wide range by variation of the energizing voltage. To control the multivibrator in the manner desired, there is additionally provided in unique combination a plurality of isolating and control circuit means which serve to linearly vary the multivibrator energizing voltage responsively to an input signal as well as correcting for such variables as changes in temperature, changes in impedance, and variation in the power supply, all to the end of providing the desired performance while utilizing a minimum number of components of reduced size and weight.

It is accordingly one object of the invention to provide a frequency modulated oscillator of reduced size, weight, and power consumption.

Another object is to provide a frequency modulated oscillator that is highly linear in operation and is insensitive to changes in temperature, power supply voltage, and input impedance.

A still further object is to provide a voltage controlled frequency modulated oscillator having great utility as a telemetering sub-carrier oscillator.

Other objects and many additional advantages will be more fully comprehended by those skilled in the art after a detailed consideration of the following specification and drawing wherein:

FIG. 1 is an electrical schematic drawing illustrating a preferred embodiment of the invention, and FIG. 2 is an electrical schematic drawing illustrating a preferred magnetic winding arrangement and saturable core structure.

Referring now to the drawing, there is shown an oscillator circuit generally comprised of a pair of junction transistors 10 and 11 interconnected in a feedback arrangement with transformer windings 12 and 13, and resistors 27 and 28 to provide an astable multivibrator whose frequency is linearly variable over a wide range by changing the voltage at junction 14 energizing the common emitter elements of the transistors.

A variable direct current intelligence signal, which may be generated from a low impedance transducer (not shown) is introduced at input terminal 15 across a high resistance potentiometer 16 and this signal is amplified, controlled, and transmitted through pairs of isolating and compensating transistors 29, 31 and 35, 36, to produce a controlled voltage at junction 14 of the oscillator for varying the frequency thereof in a linear manner.

The function of the isolating and control transistors 29, 31 and 35, 36 is to compensate for variations in the impedance of the input signal voltage source (not shown) as well as to compensate for variations due to temperature changes and other effects whereby the voltage controlling signal at junction 14 will be linearly related to the intelligence input signal at line 15 independently of these changes in the environment.

A stabilized power supply circuit including transistors 43 and 44 is provided to energize the oscillator and the pair of input and control circuits. This power supply is stabilized against changes in the energizing power voltage introduced over line 22 and, in addition, compensated for any variation that may result from changes in the temperature, all as will be more fully described hereafter.

Since the output of the multivibrator oscillator is in the form of square wave pulses and in most instances it is desired to transmit a sinusoidal waveform as the sub-carrier, the multivibrator windings 12 and 13 may be inductively coupled to an output winding 23, and the resulting output square wave impulses obtained from winding 23 may be filtered through a low pass filter circuit, generally designated 24, to by-pass the high frequency harmonics and transmit an essentially sinusoidal wave to an impedance matching potentiometer 25 and thence a sinusoidal sub-carrier over output line 26.

Considering the multivibrator unit in greater detail, the junction transistors 10 and 11 are each provided with emitter, collector and base elements with the emitter elements of both transistors being connected in common to junction point 14 to receive the energizing potential, and with the collector elements being connected to the free ends of series connected transformer windings 12 and 13. To complete the feedback interaction of transistors 10 and 11, the collector element of transistor 10 is connected to the base element of transistor 11 through a resistance 28 and the collector element of transistor 11 is connected to the base element of transistor 10 through a similar resistance 27. Both of the windings 12 and 13 are preferably wound about a single toroidal core, as shown in FIG. 2, that is comprised of a core material characterized by possessing a substantially square hysteresis loop.

When a voltage is first applied to both the emitters at junction 14, one transistor conducts more emitter-collector current than the other due to inevitable slight differences in electrical characteristics of the transistors. The differences between the resulting currents flowing through windings 12 and 13 produces a voltage change at the collector elements of the two transistors 10 and 11 which are applied through feedback resistors 27 and 28 as base drive voltages each to the other transistor. These feedback potentials progressively increase the conduction of the more conductive transistor while progressively decreasing the current through the other with the net result that one transistor is driven to full conduction and the other to cutoff in a very rapid manner producing a sharp wave front impulse in the windings 12 and 13. This, of course, all occurs very rapidly until the core reaches saturation whereupon the net flux change through the core is reduced to substantially zero and the base feedback to the conducting transistor is reduced to lower its conduction and thereby reverse the direction of flux change through the core. Due to the feedback resistors 27 and 28, this reversed flux change progressively operates to rapidly reverse the conducting conditions of the transistors and render the opposite transistor fully conducting and the initially conducting transistor at cutoff until the core is again saturated in the reverse direction whereupon the cycle is again repeated.

In this circuit it can be shown that the multivibrator frequency is directly proportional to the amplitude of applied voltage at junction 14 and consequently varying this potential at 14 in direct proportion to an input modulating signal over line 15 results in linearly varying the oscillator frequency. However since the energizing potential at point 14 also varies directly in response to changes in either the applied power supply voltage over line 22, changes in the impedance of input signal source 15, or any variation of the circuit elements due to temperature change, it is evident that this multivibrator unit is extremely sensitive to such spurious responses to change frequency and consequently would not, in itself, be useful for the accurate transmission of information by frequency modulation.

According to the present invention, however, there is provided a unique combination of controlling and regulating means employing a minimum of additional components of small size and light weight which when combined with this multivibrator substantially negate or compensate for any such spurious variation, thereby rendering the multivibrator unit responsive only to the input modulating signal received over input line 15.

Referring again to FIG. 1 for a consideration of the preferred regulating means, the input modulating signal impressed across potentiometer 16 is directed to the base control element of a first transistor 29 whose collector element is energized by the positive regulated supply voltage over line 30 and whose emitter element is connected to energize the base of element of transistor 31. The collector element of transistor 31 is also energized by the regulated supply voltage over line 30 and its emitter element is connected to one end of a resistor 32 whose opposite end is biased by a negative voltage as shown. With this arrangement of cascaded transistors 29 and 31, it can be shown that the input modulating signal received from potentiometer 16 is accurately reproduced across resistor 32 regardless of changes in the impedance of the input modulating source (not shown) since the cascaded transistors 29 and 31 together with resistor 32 present such a high input impedance across potentiometer 16 as to provide no loading thereacross. Consequently, when the resistance of potentiometer 16 is made much larger than the impedance of the input modulating source, the signal across resistor 32 is linearly proportional to the input signal and is unaffected by spurious changes in the impedance of the input signal source.

The signal across resistor 32 is then transmitted over line 34 to energize the base element of a transistor 35 in the second isolating and control circuit. Transistor 35 is connected in cascade with a transistor 36 in the same manner as transistors 29 and 31 in the first isolating and control circuit. That is, its emitter element energizes the base element of transistor 36 and its collector element, in common with that of transistor 35, is negatively energized over line 33. Interconnecting the emitter element of transistor 36 with the stabilized supply voltage over line 30 is a voltage dividing network, including a temperature responsive thermistor 37 in parallel with a fixed resistor 38 and a series connected potentiometer 39 having an adjustable tap connected to line 40 which leads to the junction point 14 of the multivibrator unit.

The characteristics of this second control circuit including the cascaded transistors 35 and 36 are essentially the same as that of control circuit 17 in that it provides an extremely high input impedance to the received intelligence input signal over line 34 and effectively isolates the input from the output over line 40, whereby the voltage signal over line 40 leading to the multivibrator is linearly related to the variable input modulating signal received over line 15. This circuit also provides a low input impedance to the multivibrator, that is necessary for proper operation thereof.

It is also important, however, to correct for any variation in the impedance of the overall circuit caused by temperature changes since it is evident that any such impedance changes serve to vary the potential over line 40 and hence vary the frequency of the multivibrator. According to the present invention, it has been found that the insertion of the parallel network of a single thermistor 37 and fixed resistor 38 can compensate for any spurious temperature effects in the modulator assuming that the stabilized power supply has also been compensated for any variation due to temperature change. Thus the judicious selection of a single suitable thermistor 37 and fixed resistor 38 in parallel arrangement in the emitter circuit of transistor 36 stabilizes the voltage to junction 14 of the multivibrator against variation due to temperature change.

As thus far described it is evident that there is provided a voltage sensitive free running multivibrator together with means for accurately and linearly controlling the voltage energizing the multivibrator in response to variation of an input intelligence signal. Such means are also insensitive to spurious changes in the impedance of the input intelligence source and impedance changes brought about by a changing temperature of the environment.

Since the potential over line 40 energizing the multivibrator junction 14 is also directly related to the power supply voltage over line 30 applied to the opposite end of potentiometer 39, even the smallest variation in the power supply voltage is directly reflected as a spurious change in multivibrator frequency, and it is essential that the power supply be regulated within precise limits and be rendered insensitive to any variation due to temperature change. To supply these functions while employing a minimum number of components, the preferred regulator shown and described hereafter is employed.

The voltage from the power supply (not shown) is introduced through a resistor 41 to a junction 42, which is connected to ground through a diode 47 operating in the Zener region. Due to the abrupt reverse conduction characteristics of Zener diode 47, the junction 42 is maintained at substantially constant voltage despite variation of the power supply voltage on line 22. However, due to the extreme sensitivity of the multivibrator to even the smallest variation in power supply voltage, additional regulating means, including transistors 43 and 44, are incorporated to further stabilize the power supply voltage and to compensate for any temperature variation.

The potential at junction 42 is also directed in series through the emitter-collector elements of transistor 43 to the potential line 30 and consequently the impedance of transistor 43 serves as a series impedance, which may be increased or decreased to oppose changes in the voltage at 42 to maintain constant the potential on line 30. To control the impedance of transistor 43, the potential at junction 42 is also directed through a resistor 60 to the base element of transistor 43 and also to the collector element of transistor 44, and then to the emitter element of 44 and to ground through a parallel circuit including capacitor 46 in one path and a Zener diode 45 in series with two forwardly poled diodes 48 and 49 in the other. The function of this diode-capacitor parallel circuit is to provide a stabilized and temperature compensated voltage at the junction 50 leading to the emitter element of transistor 45. The stabilization is, of course, provided by the Zener diode 45 and capacitor 46. However, since the Zener diode 45 possesses a negative temperature coefficient, the forwardly poled diodes 48 and 49 having a positive temperature coefficient to maintain the potential at junction 50 constant despite changes in temperature.

Thus the circuit for regulating the emitter-collector impedance of transistor 44 comprises essentially a fixed resistance 60 in series with a transistor 44 and a fixed and temperature stabilized potential at junction 50.

Assuming that the potential on line 30 should momentarily increase, this increase is transmitted to the base element of transistor 44 over line 70, which in turn increases the current flow through the emitter-collector elements of transistor 44 resulting in an increased potential drop across series resistor 60. This voltage drop serves to lower the potential at the base element of transistor 43, increasing its impedance and reducing the current flow therethrough to line 30 to restore the potential on line 30 to its stabilized value. In a similar manner any momentary decrease in the potential of line 30 is reflected as a decrease of current through transistor 44 to increase the potential on line 30 to its preselected value thereby instantaneously correcting or regulating the voltage on line 30. It is to be particularly noted that transistor 44 serves as an extremely fast acting and rather high gain amplifier, whereby even the smallest variation in the potential on line 30 is rapidly corrected. As an example of the effectiveness of this regulator, such circuits have been operated so precisely that a change of 10% in the power supply voltage received over input power line 22 only serves to vary the potential on line 30 by an amount representing a change of only .07% of its preselected value.

As best shown in FIG. 2, the windings 12, 13, and 23 are all preferably wound about a single miniature toroidal core 51 having a square hysteresis loop characteristic as generally discussed above. As an additional feature according to the present invention, a pair of additional windings 52 and 53 are also wound about this core 51 and inductively coupled with the multivibrator windings 12 and 13. The purpose of these additional windings 52 and 53 is to utilize the power being generated by the multivibrator to additionally supply the bias potentials for input and control transistors 29, 31 and 35, 36 and thereby eliminate the need for additional low voltage bias sources.

What is claimed is:

1. In a voltage controlled variable frequency oscillator, a multivibrator responsive to a variable energizing potential to vary its frequency, a potential divider circuit including a plurality of resistors and having two opposite end terminals and a third terminal intermediate the two ends, a temperature compensated and voltage stabilized power supply circuit energizing one terminal of said voltage divider, impedance isolating means for coupling an input modulating signal to variably energize the second terminal in linear proportion to said input signal, said voltage divider circuit including a resistor having a negative temperature coefficient of resistance sufficient to compensate for impedance variations with temperature in said multivibrator, impedance isolating means, and said potential divider; and means coupling the third terminal of said potential divider to energize the multivibrator.

2. In the oscillator of claim 1, said multivibrator including a plurality of windings inductively coupled by a square hysteresis loop saturable core, and a pair of transistors connected in positive feedback relation through said windings.

3. In the oscillator of claim 2, said impedance isolating means including at least one pair of transistors coupled in cascaded relation, a potential bias winding inductively coupled to said multivibrator windings, and means for rectifying the potential generated by said bias, winding and applying the rectified potential to provide direct current bias energization for said impedance isolating transistors.

4. In the oscillator of claim 2, said temperature and voltage stabilized power supply including a regulating transistor in series connection coupling the input power voltage to said first end of the potentiometer, a second transistor circuit responsive to said input power voltage for establishing a substantially constant and temperature compensated voltage junction and being connected to energize said regulating transistor, said second transistor circuit being further responsive to the potential at said first end of the potentiometer to vary the energization of the regulating transistor and correct for any deviations thereof from a predetermined value.

5. In a variable frequency oscillator, a transistor multivibrator including a plurality of saturable windings having square loop hysteresis characteristics, a potential divider connected to energize said multivibrator, a temperature compensated and voltage stabilized power supply energizing one end terminal of said potential divider, and impedance isolating means coupling an input modulating signal to energize the opposite end terminal of the potential divider, said isolating means being insensitive to variation in the impedance of said input modulating signal source.

6. In the oscillator of claim 5, said potential divider including a resistance having a negative temperature coefficient of resistance, thereby to stabilize against variation in the oscillator frequency resulting from temperature change.

7. In the oscillator of claim 6, an additional winding inductively coupled to said plurality of windings, means for rectifying the potential generated by said additional winding, and means coupling said rectified potential to bias said impedance isolating means.

8. In the oscillator of claim 7, said power supply including a first Zener diode circuit energizable by a power source to establish a first junction of substantially constant voltage, an amplifying transistor and second Zener diode circuit connected in series relation with said first junction, means energizing said amplifying transistor by the voltage output of said power supply, a second transistor connected to control said voltage output, and means coupling said amplifying transistor to regulate said second transistor thereby to control and stabilize said voltage output.

9. In the oscillator of claim 8, temperature compensating means for correcting for the temperature variation of said Zener diodes.

10. A temperature compensated direct current voltage regulator comprising a potential divider including a first resistor and diode poled for operation in its Zener region and being energizable by a voltage, a transistor having a base, collector and emitter junctions, means interconnecting the emitter-collector junction of said transistor in series circuit between said Zener diode and an output line, a second resistor interconnecting the Zener diode and the base junction of said transistor, and amplifying means responsive to variation of the potential on said output line from a preselected value to vary the current through the second resistor, thereby to vary the potential at the base element of the transistor and change the impedance in series between the Zener diode and output line to regulate the voltage on the output line, said means varying the current through the second resistor including a second transistor having a base, collector, and emitter junctions, means connecting the emitter collector junctions of the second transistor in series with said second resistor, and means interconnecting the base junction of the second transistor for energization by the potential on said output line.

11. In the regulator of claim 10, a voltage stabilizing and temperature compensating means for said second transistor comprising a parallel circuit including in one leg thereof a first diode operating in the Zener region and additional diode means in series therewith and operating in the forward conduction region.

12. In the regulator of claim 11, said second leg including a capacitor, and means connecting said parallel circut in series circuit relationship with said second transistor and second resistor.

13. A temperature compensated direct current amplifier having a high input impedance and low output impedance comprising: a resistance connected in series circuit with a resistance network including a temperature sensitive resistance, one terminal of said series circuit being energizable by a regulated source of direct current potential and means accurately regulating current flow through said series circuit in proportion to an input signal, said means including a pair of transistors; each transistor having a base, collector, and emitter electrodes; means connecting the emitter-collector elements of one of said transistors in series circuit relation with said resistance and resistance network, means connecting the emitter-collector electrodes of the other transistor across the base-collector electrodes of the first mentioned transistor, and means coupling an input signal to energize the base electrode of said other transistor.

14. A temperature compensated direct current amplifier having a high input impedance and low output impedance comprising: a first pair of N-P-N transistors in an emitter follower circuit arrangement and each having base, collector, and emitter elements with the collector elements of both transistors being energizable by a positive source of voltage, a first pair of P-N-P transistors in an emitter follow circuit, and each having base, collector and emitter elements with the collector elements of both P-N-P transistors being energizable by a negative source of voltage, means direct coupling the emitter of the second N-P-N transistor with the base of the first P-N-P transistor, means direct coupling an input signal to the base of the first N-P-N transistor, a three terminal output network, means coupling one terminal to the emitter of the second P-N-P transistor and a second terminal to a positive direct current voltage, said network including a temperature sensitive resistor, and means obtaining an output signal from the third terminal that is linearly proportional to the input signal and substantially unaffected by variation in temperature.

15. In the amplifier of claim 14, said network comprising a potential divider circuit including said temperature sensitive resistor in one portion thereof and a variable resistor having a movable tap, constituting the third terminal of the network.

16. A bias potential generating circuit comprising an astable multivibrator having a pair of saturable winding in inductive relationship on a core of rectangular hysteresis material, an additional winding on said core in inductive relationship with said windings and rectfying means coupled to said additional winding for rectifying the voltage induced therein and providing a direct current bias potential, a signal transmission circuit for conveying a variable voltage signal to said multivibrator to change the frequency thereof, and means for conveying said direct current bias potential in feedback relation to energize said transmission circuit.

17. In the circuit of claim 16, said multivibrator including a pair of transistors connected in positive feedback relation through said windings.

18. In a variable frequency oscillator, a transistor multivibrator including a plurality of saturable windings having rectangular hysteresis characteristics, a potential divider connected to energize said multivibrator, means connecting a constant potential and temperature insensitive voltage source to energize one end terminal of said potential divider, and impedance isolating means coupling an input modulating signal to energize the opposite end terminal of the potential divider, said isolating means being insensitive to variation in the impedance of said input modulating signal source.

References Cited in the file of this patent

UNITED STATES PATENTS

| | | |
|---|---|---|
| 2,740,086 | Evans et al. | Mar. 27, 1956 |
| 2,751,549 | Chase | June 19, 1956 |
| 2,783,380 | Bonn | Feb. 26, 1957 |
| 2,843,745 | Smith | July 15, 1958 |
| 2,852,746 | Sheele | Sept. 16, 1958 |
| 2,889,416 | Shea | June 22, 1959 |
| 2,904,742 | Chase | Sept. 15, 1959 |
| 2,934,750 | Schaefer | Apr. 26, 1960 |
| 2,970,301 | Rochelle | Jan. 31, 1961 |